United States Patent [19]

Perry et al.

[11] Patent Number: 4,519,851
[45] Date of Patent: May 28, 1985

[54] METHOD FOR PROVIDING PINHOLE FREE DIELECTRIC LAYERS

[75] Inventors: Charles H. Perry; Robert R. Shaw, both of Poughkeepsie, N.Y.

[73] Assignee: International Business Machines Corporation, Armonk, N.Y.

[21] Appl. No.: 621,335

[22] Filed: Jun. 15, 1984

[51] Int. Cl.³ .............................................. C23F 7/02
[52] U.S. Cl. .................................. 148/6.31; 148/6.3; 148/6
[58] Field of Search ............................ 148/6.3, 6.31, 6

[56] References Cited

U.S. PATENT DOCUMENTS 3,939,293  2/1976  Brusic ................................ 148/6.3

Primary Examiner—Sam Silverberg
Attorney, Agent, or Firm—Anne Vachon Dougherty; John A. Jordan

[57] ABSTRACT

A method is taught for repairing pinholes in dielectric layers and thereby avoiding metal shorts. The method is applied after the dielectric has been deposited on a base of conductive metallurgy and involves heating the metal-dielectric layers in an oxygen ambient and thereby oxidizing any exposed metal. The metal-oxide formed in the pinhole effectively insulates the underlying metal from a subsequently deposited metal; and, hence acts to prevent metal-to-metal shorts.

6 Claims, 2 Drawing Figures

METHOD FOR PROVIDING PINHOLE FREE DIELECTRIC LAYERS

BACKGROUND OF THE INVENTION

This invention relates generally to the technology concerned with glass dielectric layers. Specifically, the invention is directed to thin film dielectric layers deposited on conductive metallurgy. In the technology, there is a common problem of pinhole defects or opens in the dielectric layers. These pinholes, which expose the underlying metal, represent unintended vias which become threatening inter-level shorts when filled with metal during subsequent deposition. The presence of pinholes essentially destroys the utility of the configuration. If there are pinhole defects, the unit will generally be discarded with low product yields based on these defects. In the alternative, one repair technique has been utilized which involves depositing a second dielectric layer over the defective first layer; and thereby, presumably, filling in the first layer pinholes with the subsequently deposited dielectric. The obvious drawbacks to this procedure include the necessity of performing an additional deposition step and the resultant thick film contributes to a downgrading of the ultimate device.

SUMMARY OF THE INVENTION

It is therefore an objective of the present invention to present a method for providing a pinhole defect free thin film dielectric layer deposited on conductive metallurgy.

It is another objective of the present invention to provide a method for repairing pinhole defects in thin dielectric layers.

It is a further objective of the invention to provide a method for repairing dielectric layer pinhole defects without downgrading the device.

Finally, it is an objective of the invention to provide a means for increasing yields in dielectric-metal technology by reducing the likelihood of defective product.

These and other objectives are realized by the present method for providing pinhole-free dielectric layers by oxidizing the underlying metal exposed at the bottom of the pinhole and effectively insulating that metal from subsequent metallization.

DETAILED DESCRIPTION OF THE PREFERRED EMBODIMENT

Figure 1:
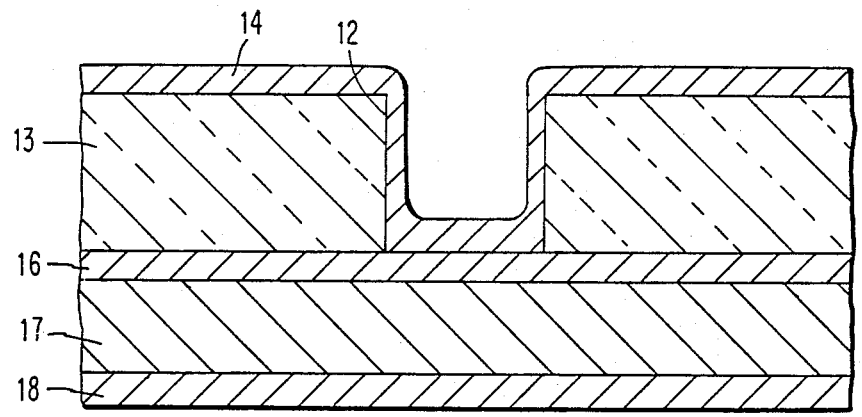
FIG. 1 is a cross-sectional view illustrating the pinhole exposed metal to layered metal short problem encountered in the prior art methods of fabrication.

Pinhole defects, such as the one illustrated, at 12, in FIG. 1, result frequently when depositing very thin dielectric layers. In the case of the underlying layer 16, being a metal, the pinhole defects expose a segment of the metal layer and pose a serious threat of interlevel shorts when the pinholes, as unintended vias, become filled with metal during subsequent metal layer, 14, deposition.

Figure 2:
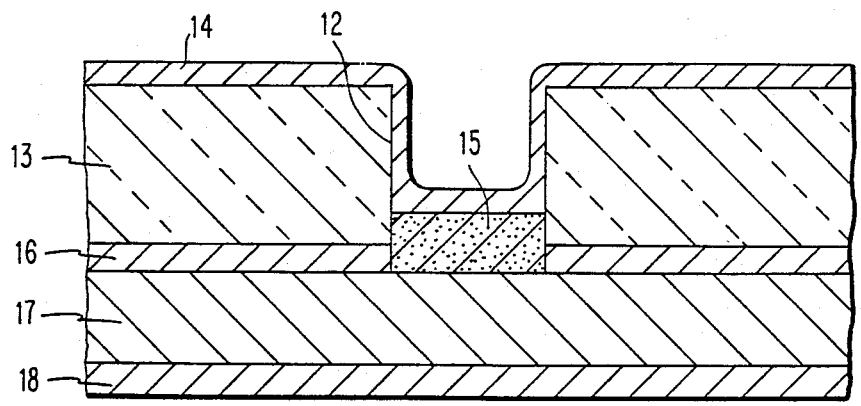
FIG. 2 is a cross-sectional view illustrating the metal/dielectric layers formed in accordance with the subject invention.

In the preferred embodiment of the invention, as illustrated in FIG. 2, the underlying conductive metallurgy is a chromium-copper-chromium (Cr-Cu-Cr) sandwich, 16-17-18 deposited on a substrate. As is known in the art, a dielectric, such as silicon dioxide or alumina, will not adhere directly to the highly conductive copper; and, so, the intermediate thin film layers of chromium provide the needed conduit for the high conductance of Cu and the necessary adhesive qualities for forming the dielectric:metal layers. When the dielectric 13 is deposited over the chromium top layer, 16, of the underlying metallurgy, using for example a sedimentation process, in a reducing atmosphere at 820° C. temperature, pinholes do appear and expose the underlying chromium layer. If untreated at this point, the result upon subsequent metallization is that, as seen in FIG. 1, of the metal-to-metal 16-14 contact and therefore shorting. However, if, in a step preliminary to the metallization, the pinhole-exposed underlying metal is insulated from the subsequent metallization, then the possibility of shorting is greatly reduced. It is an inoperative solution to treat each pinhole individually with a layer of insulative dielectric because of the shear volume, spontaneity and non-uniformity of the defects. Furthermore, it is a wasteful and device-downgrading solution to re-treat the entire surface with a second layer of dielectric material. Therefore, in order to provide a stable, non-conductive barrier layer between the pinhole-revealed underlying metal, 16, and the subsequently deposited metal, 14, the solution proposed is a treatment of the entire substrate to an oxidizing atmosphere. By heating the glassed substrate to a temperature of ~700° C. in an oxygen ambient, the exposed metal, herein a pinhole section of chromium layer 16, is oxidized and becomes a barrier layer 15 of chromic oxide, $Cr_2O_3$, in the pinhole while the glass layer is unaffected by the oxidation process. The gas phase oxidation step leaves the $Cr_2O_3$ in the affected area alone since the glass or other inorganic dielectric coat 13 protects the rest of the base metal layer 14. The $Cr_2O_3$ layer, 15, then acts as an insulating barrier or high series resistance which will have little effect on the base metal conductivity and which will not reduce.

In the illustrated embodiment, the volume change upon conversion of Cr to $Cr_2O_3$ is essentially a doubling of volume from the reacted Cr to the resulting $Cr_2O_3$ layer. $Cr_2O_3$ is a p-type semiconductor, having resistive qualities such that in a pinhole cross-section of 100 $\mu m^2$, having a $Cr_2O_3$ thickness of 1600 Å, the resistance of the $Cr_2O_3$ barrier should be 100 k$\Omega$–5 M$\Omega$. This resistance should be high enough to provide for functionality (i.e. no shorting) of the unit with only minimal degradation in the electrical performance of the unit.

The glass layer, herein borosilicate for example, can be any dielectric passivation layer which is both sensitive to pinhole defects and resistant to oxidation or to other insulation processes. Similarly, the process will be effective whatever the underlying, exposed metallurgy, provided that the top layer thereof can be oxidized or otherwise rendered non-conductive and not later be subject to reduction during further processing and/or use. The embodiment described refers to gas phase oxidation using heat (e.g. 700° C.) to effectuate the process. Electrochemical processes, laser stimulation or other well-known processes can be used to render the exposed metal non-conductive, provided, again, that the dielectric layer remains inert to the process.

While the invention has been particularly shown and described with reference to a preferred embodiment, it will be understood by those skilled in the art that modifications in detail may be made without departing from the spirit and scope of the invention.

What is claimed is:

1. A method for forming a pinhole defect free dielectric layer over a substrate-supported conductive metallurgical pattern comprising the steps of:
    forming said pattern with a top film of oxidizable metal, the metal oxide of which is nonconductive;
    coating said pattern with a dielectric layer; and,
    converting all of said oxidizable metal top film which is exposed by said pinholes to a nonconductive material by treating the entire substrate to an oxidation process, said process oxidizing the exposed metal while leaving said dielectric and said underlying pattern unchanged.

2. The method for forming a pinhole defect free dielectric layer as found in claim 1 whereby said converting step is done by heating said substrate in an oxygen ambient.

3. The method for forming a pinhole defect free dielectric layer as found in claim 2 whereby said top film is chromium and said converting step is oxidation to convert all chromium exposed by any said pinholes to chromic oxide.

4. A method for repairing pinholes in dielectric layers deposited over substrate-supported conductive metallurgical patterns having oxidizable top metal films, whose metal oxides are nonconductive, and underlying metallurgy comprising:
    converting all said oxidizable metal film exposed by said pinholes to non-conductive materials by treating the entire substrate to an oxidation process, said process oxidizing the exposed metal while leaving said dielectric and said underlying metallurgy unchanged.

5. A method as in claim 4 whereby said oxidation is done by heating said substrate in an oxygen ambient.

6. A method as in claim 5 whereby said top film is chromium and said converting is done by oxidizing said chromium to convert all exposed chromium to chromic oxide.

* * * * *

Disclaimer and Dedication 4,519,851—*Charles H. Perry; Robert R. Shaw*, both of Poughkeepsie, N.Y. METHOD FOR PROVIDING PINHOLE FREE DIELECTRIC LAYERS. Patent dated May 28, 1985. Disclaimer and Dedication filed Nov. 23, 1990, by the assignee, International Business Machines Corporation.

Hereby disclaims and dedicates to the public the remaining term of said patent.
[ *Official Gazette June 4, 1991* ]